(12) United States Patent
Yamamoto et al.

(10) Patent No.: US 9,117,788 B2
(45) Date of Patent: Aug. 25, 2015

(54) HEAT SINK DEVICE AND METHOD OF REPAIRING SEMICONDUCTOR DEVICE

(75) Inventors: Tsuyoshi Yamamoto, Kawasaki (JP); Naoaki Nakamura, Kawasaki (JP); Rie Takada, Kawasaki (JP); Kenichiro Tsubone, Kawasaki (JP); Yasuhide Kuroda, Kawasaki (JP); Harumi Yagi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 907 days.

(21) Appl. No.: 13/184,723

(22) Filed: Jul. 18, 2011

(65) Prior Publication Data
US 2012/0024512 A1    Feb. 2, 2012

(30) Foreign Application Priority Data
Jul. 28, 2010 (JP) ................. 2010-169067

(51) Int. Cl.
*H01T 23/00* (2006.01)
*H01L 23/36* (2006.01)

(52) U.S. Cl.
CPC ....... *H01L 23/36* (2013.01); *H01L 2224/16225* (2013.01); *H01L 2224/73253* (2013.01); *Y10T 29/49721* (2015.01)

(58) Field of Classification Search
CPC ............... E04F 15/02; E04F 15/02038; E04F 15/02005; E04F 15/02033; E04F 2201/02–2201/028; H01L 2224/74; H01L 21/4875; H01L 24/74; H01L 24/799; H01L 24/98; H01L 2224/98; Y10T 29/49721; Y10T 29/49726
USPC ................. 29/402.03, 402.06, 402.11, 426.1, 29/426.5, 426.4
See application file for complete search history.

(56) References Cited

U.S. PATENT DOCUMENTS 7,763,146 B2 *  7/2010  Eguchi .................. 156/711
2005/0049350 A1   3/2005  Tonapi et al.

FOREIGN PATENT DOCUMENTS

| JP | 02-000079 U | 1/1990 |
| JP | 04-186752 | 7/1992 |
| JP | 10-173372 A | 6/1998 |
| JP | 2000-022059 | 1/2000 |
| JP | 2005-136197 | 5/2005 |
| JP | 2005-175323 | 6/2005 |
| JP | 2007-142294 | 6/2007 |
| JP | 2007-234192 | 9/2007 |
| TW | 200635492 A | 10/2006 |

OTHER PUBLICATIONS

Japanese Office Action Notification of Reasons for Refusal application No. 2010-169067 dated Mar. 4, 2014.
(Continued)

*Primary Examiner* — Christopher Besler
(74) *Attorney, Agent, or Firm* — Squire Patton Boggs (US) LLP (57) ABSTRACT

A method of repairing a semiconductor device includes turning a press member to apply pressure on an electronic component which is mounted on a substrate. A heat sink which is provided on the electronic component via a bonding layer is thus displaced with respect to the electronic component in a transverse direction. The heat sink is removed from the electronic component by shearing the bonding layer with the press member.

1 Claim, 12 Drawing Sheets

(56) References Cited

OTHER PUBLICATIONS

Office Action dated Apr. 9, 2014, cited in corresponding Chinese Patent Application No. 201110211985.9 (with English translation).
Office Action dated Jul. 16, 2014, issued in corresponding TW Application No. 100123876 (with English translation).
Office Action dated Oct. 15, 2014, issued in corresponding Chinese Patent Application No. 201110211985.9 (with English translation).
Office Action dated Apr. 21, 2015, issued in corresponding CN Patent Application No. 201110211985.9 (with English translation).
European Search Report dated Jun. 26, 2015 corresponding to European Patent Application No. 11173852.2.

* cited by examiner

HEAT SINK DEVICE AND METHOD OF REPAIRING SEMICONDUCTOR DEVICE

CROSS-REFERENCE TO RELATED APPLICATION

This application is based upon and claims the benefit of priority of Japanese Patent Application No. 2010-169067, filed on Jul. 28, 2010, the entire contents of which are incorporated herein by reference.

FIELD

The embodiments discussed herein relate to a heat sink device and a method of repairing a semiconductor device.

BACKGROUND

Electronic components such as a power transistor and an IC package, which are mounted on a printed circuit board (PCB) generate heat during operation thereof. Thus, a heat sink for releasing heat from the electronic component is often provided on the electronic component. The size of the heat sink is selected in accordance with a cooling capacity suitable for an amount of heat generation from the electronic components. Accordingly, the heat sink may be bigger than the electronic component as necessary.

Heat sinks are in tight contact on heat-generating electronic components to achieve a good heat-releasing effect. For example, JP-A-4-186752 and JP-A-2000-22059 disclose a method of mounting a heat sink to an electronic component in which a heat sink is placed on an electronic component. The heat sink provided on the electronic component is further secured to a mother board with a screw or a clip, or by stretching a wire. However, a screw hole or a clip insertion hole, or an anchoring member for stretching the wire is to be provided on the printed circuit board, which results in reduction of the mounting space for electronic components on the printed circuit board. To counter this, JP-A-2007-142294 discloses a method of bonding a heat sink to an electronic component with cement.

On the other hand, electronic components may be removed from the printed circuit board and repaired (or replaced) due to defects. The defective electronic component may be removed from the printed circuit board by locally reflowing solder joint of the defective electronic component. However, in a case that a heat sink is provided on the defective electronic component, the heat from the reflow is released through the heat sink, thereby making it difficult to melt solder joint of the target electronic component.

To counter this, the above-mentioned JP-A-2007-142294 discloses the heat sink device having a heating element and the heat sink which are bonded via the cement. A threaded through-hole for separation is formed in the upper part of the heat sink for separating the heat sink from the heating element, and a separation jig is provided which screws into the threaded hole for separation.

However, when the heat sink and the heating element are strongly bonded with each other, a powerful force has to be applied to the bonding surface of the heat sink for separation. According to JP-A-2007-142294, the heat sink is vertically separated from the heating element. Thus, the heating element may be damaged. That is, in case of using strong cement, an excessive mechanical stress has to be applied to the electronic component, which may break the electronic component.

SUMMARY

According to an embodiment of the invention, a method of repairing a semiconductor device includes turning a press member to apply pressure on an electronic component which is mounted on a substrate. A heat sink which is provided on the electronic component via a bonding layer is thus displaced with respect to the electronic component in a transverse direction. The heat sink is removed from the electronic component by shearing the bonding layer with the press member.

It is to be understood that both the foregoing general description and the following detailed description are exemplary and explanatory, and are not restrictive of the invention.

DESCRIPTION OF EMBODIMENTS

Referring to the attached drawings, embodiments of the present invention will be described in detail below. Examples of a method of repairing a semiconductor device in which a heat sink for releasing heat of an IC package mounted on a printed circuit board accommodated in electronic equipment is removed from the IC package, and examples of a structure of the heat sink, serving as a heat-releasing mechanism, will be described.

Figure 1A:
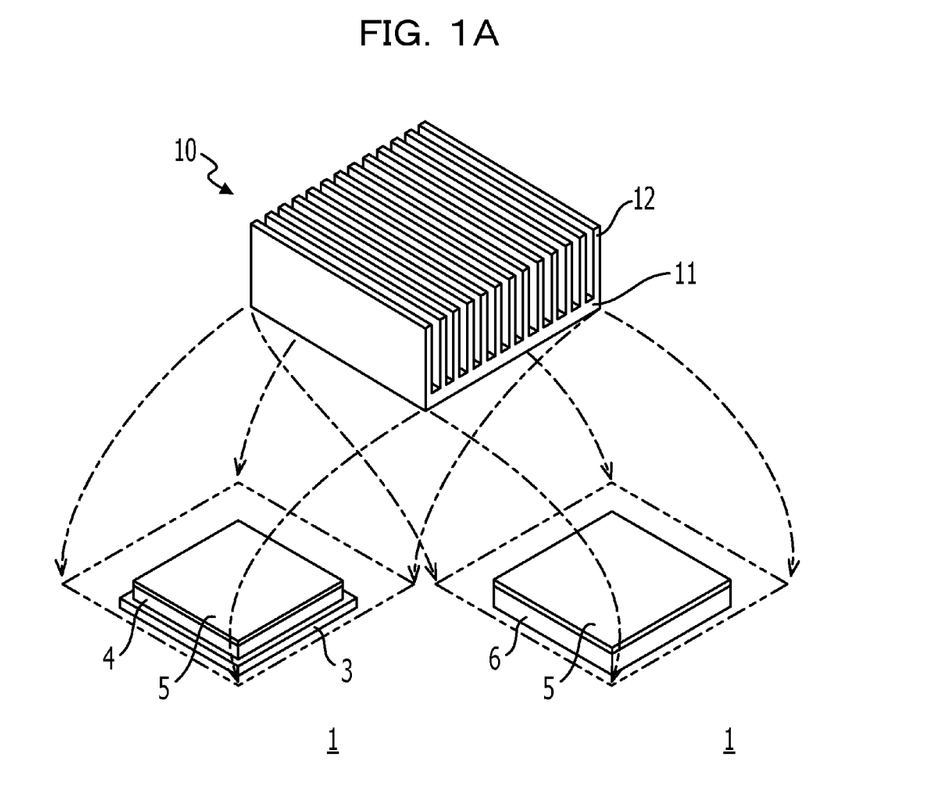
FIGS. 1A to 1C illustrate a heat sink and two packaging types of an electronic component.

First, referring to FIGS. 1A to 1C, a state in which a heat sink 10 is mounted onto a heat-generating electronic component mounted onto a printed circuit board 1 will be described. As shown in the example of FIG. 1A, there can be two modes of mounting the heat sink 10 onto an electronic component, such as an IC package. The first mounting mode is shown on the left side in FIG. 1A, in which a heat spreader 4 is secured onto an electronic component 3, and a heat sink 10 is mounted onto the heat spreader 4 with a bonding layer 5, such as adhesive or an adhesion sheet, therebetween. The second mounting mode is shown on the right side in FIG. 1A, in which the heat sink 10 is directly mounted onto an entirely resin-molded electronic component 6 with the bonding layer 5, such as adhesive or an adhesion sheet, therebetween. The bonding layer 5 has thermal conductivity, and, in either mode, the heat sink 10 is attached to the position indicated by the two-dot chain line.

Figure 1B:
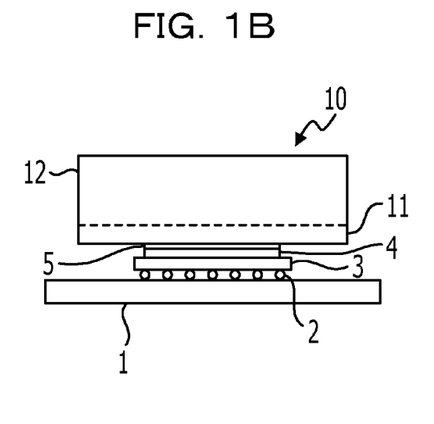
Figure 1C:
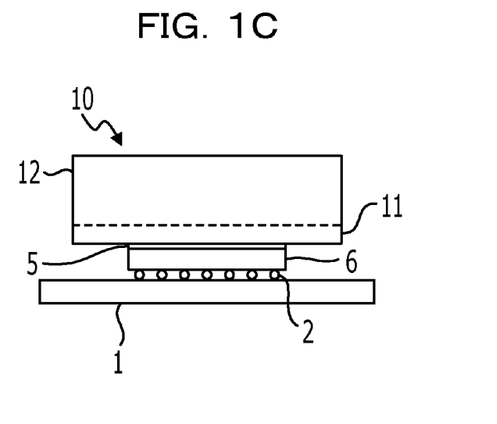

FIG. 1B is a side view of the first mounting mode. The electronic component 3 is connected to a wiring pattern on the printed circuit board 1 through conducting members, such as gold balls, or a bonding terminal land (pad). FIG. 1C is a side view of the second mounting mode, and, in this case too, the electronic component 6 is connected to a wiring pattern on the printed circuit board 1 through conducting members, such as gold balls, or a bonding terminal land (pad). The heat sink 10 can be made of aluminum or copper, which has an excellent heat releasing property, and has parallel fins 12, which are multiple sheets disposed upright on a base plate 11 so as to increase the surface area. There is also a pin-fin heat sink, in which multiple pin-like projections, formed by cutting grooves, are arranged on the base plate 11. In either shape, the base plate 11 that comes into tight contact with the electronic component 3 or 6 has a certain thickness and rigidity so as to maintain the flatness of the contact surface.

Figure 2A:
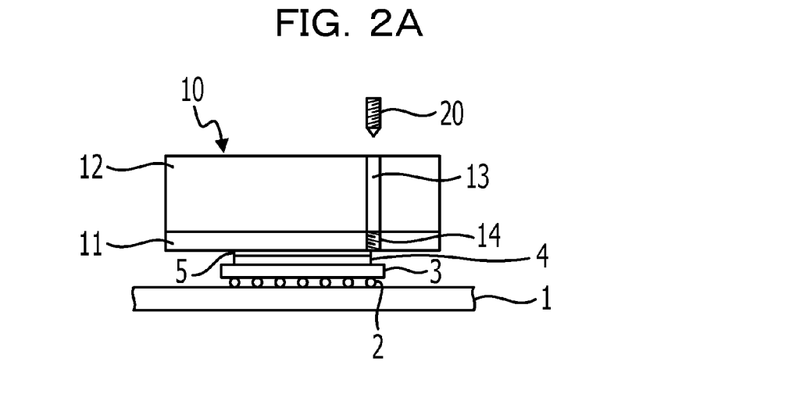
FIG. 2A schematically illustrates a side view of a heat sink a method of repairing a semiconductor device according to a first embodiment of the present invention.
Figure 2B:
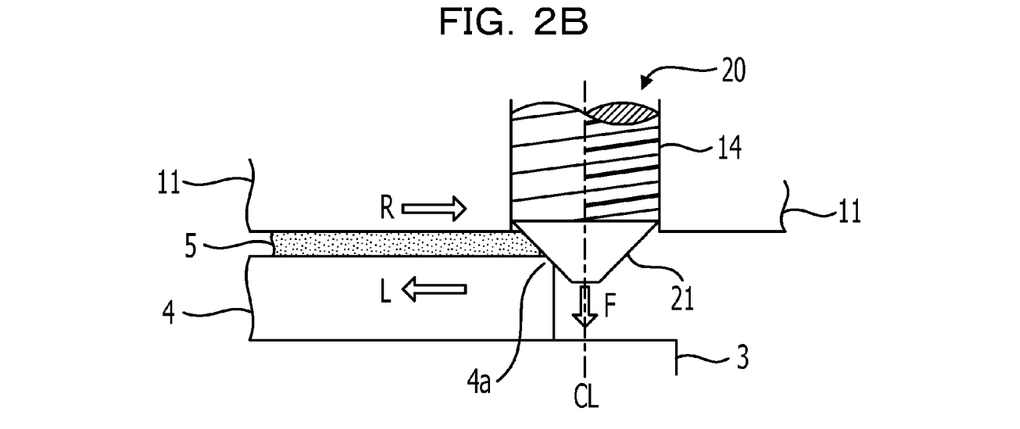
FIG. 2B is an enlarged cross-sectional view of the heat sink depicted in FIG. 2A.
Figure 2C:
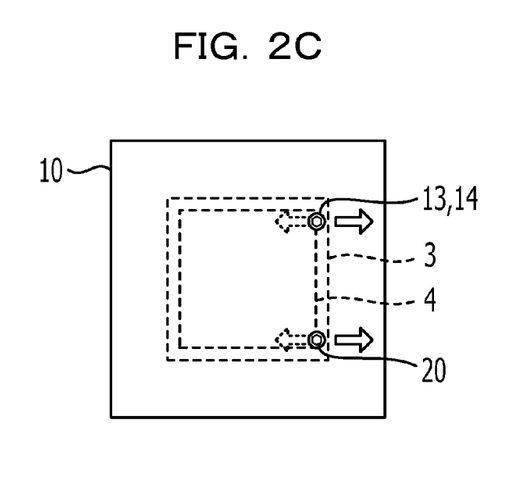
FIG. 2C is a plan view of the heat sink in FIG. 2A.

FIGS. 2A to 2C show a method of repairing a semiconductor device according to a first embodiment of the present invention and a heat sink in the first mounting mode used in this method. Note that, in the embodiment described below, a method of separating the heat sink 10 from the electronic component 3 in the first mounting mode shown in FIG. 1B will be described. The description of a method of separating the heat sink 10 from the electronic component 6 in the second mounting mode will be omitted because it is the same as that in the first mounting mode, except that the heat spreader 4, described below, is replaced by the entirely resin-molded electronic component 6.

Figure 2D:
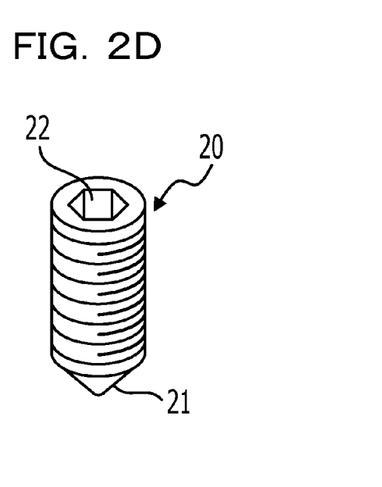
FIG. 2D is a perspective view of a press member according to the first embodiment.

FIG. 2A illustrates a state in which the heat sink 10 according to an embodiment is mounted onto the heat spreader 4, with the bonding layer 5 therebetween, which is secured onto the electronic component 3 mounted onto the printed circuit board 1. In the heat sink 10, a pit 13 is provided in the fins 12, and a screw hole 14 communicating with the pit 13 is provided in the base plate 11. A setscrew 20, serving as a press member and having a hexagonal hole 22 in the head, as shown in FIG. 2D, is inserted into the pit 13. The tip of the setscrew 20 is a conical portion 21. Note that the pit 13 may not be provided when the distance between the fins 12 is large.

FIG. 2B illustrates the relevant part of FIG. 2A in an enlarged state. The screw hole 14 is provided in the heat sink 10 such that, when a cross section of the screw hole 14 taken in the direction perpendicular to an axis CL is projected on the heat spreader 4 in the direction of the axis CL (on the electronic component 3, in the second mounting mode), a part of the cross section overlaps the heat spreader 4. Furthermore, the screw hole 14 can be provided such that the extension of the axis CL of the screw hole 14 is on the outer side of an upper end 4a of the heat spreader 4 (on the outer side of an upper end of the electronic component 3, in the second mounting mode).

As a result, when the setscrew 20 having the conical portion 21 is inserted into the screw hole 14 and is rotated by a hexagonal wrench fitted to the hexagonal hole 22 so that the conical portion 21 protrudes from the screw hole 14, the conical portion 21 comes into contact with the upper end 4a of the heat spreader 4. This state is shown in FIG. 2B. From this state, when the setscrew 20 is rotated further to move the conical portion 21 in the arrow F direction, the heat spreader 4, being pushed by the conical portion 21, moves in the arrow L direction, and the base plate 11 moves in the arrow R direction opposite to the arrow L direction. Such movements of the heat spreader 4 and the base plate 11 cause a shearing force to act on the bonding layer 5.

In general, the bonding layer 5 is more susceptible to a shearing force than to a tensile strength. The heat spreader 4 bonded to the electronic component 3 has a large area in the horizontal direction and a small thickness in the vertical direction. Accordingly, it is thought that a bonding force of the bonding layer 5 can be more safely reduced to separate the heat sink 10, while suppressing the influence of the mechanical stress on the heat spreader 4 by applying an external force to the bonding layer 5 in a horizontal shearing direction.

The pit 13 and the screw hole 14, forming a pair, may be provided at one location in the heat sink 10. In this embodiment, however, such pairs are provided at two locations along one side of the heat sink 10, as shown in FIG. 2C. By providing the pit 13 and screw hole 14 pairs at two locations, large parallel shearing forces can be applied to the bonding layer 5. Furthermore, as in another embodiment shown in FIG. 3A, by providing the pit 13 and screw hole 14 pairs at two locations in the diagonal direction, along opposing sides of the heat sink 10, a shearing force in the rotational direction can be applied to the bonding layer 5.

Figure 3A:
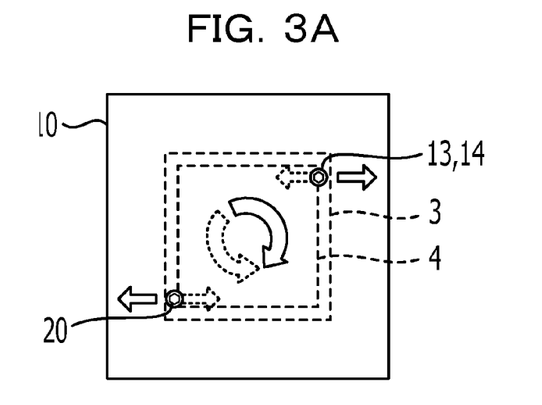
FIG. 3A is a plan view of a modified example of the heat sink according to the first embodiment.
Figure 3B:
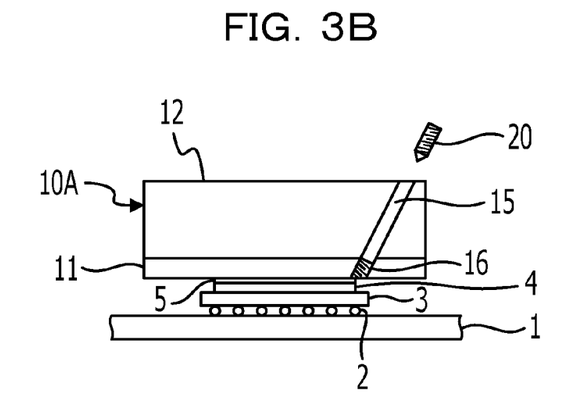
FIG. 3B is a side view of the heat sink depicted in FIG. 3A.

FIG. 3B illustrates a heat sink 10A, which is a first modification of the first embodiment described with reference to FIGS. 2A to 3A. In the heat sink 10 according to the first embodiment, the pit 13 is provided in the fins 12, and the screw hole 14 communicating with the pit 13 is provided in the base plate 11. In contrast, in the heat sink 10A of the first modification, an inclined hole 15 is provided in the fins 12, and a screw hole 16 communicating with the inclined hole 15 is provided in the base plate 11. Similarly to the above, the setscrew 20, serving as a press member, having the hexagonal hole 22 in the head, as shown in FIG. 2D, is inserted into the inclined hole 15.

Figure 3C:
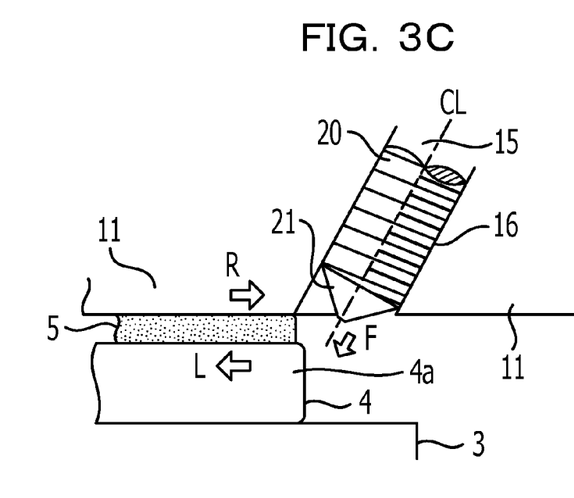
FIG. 3C is an enlarged cross-sectional view of the heat sink depicted in FIG. 3B.

FIG. 3C illustrates the relevant part of FIG. 3B in an enlarged state. The inclined hole 15 is provided in the heat sink 10A such that, when the cross section of the inclined hole 15 taken in the direction perpendicular to the axis CL is projected on the heat spreader 4 in the direction of the axis CL (on the electronic component 3 in the second mounting mode), a part of the cross section overlaps the heat spreader 4. Furthermore, the inclined hole 15 is provided such that the extension of the axis CL of the inclined hole 15 is on the outer side of the upper end 4a of the heat spreader 4 (on the outer side of the electronic component in the second mounting mode).

As a result, when the setscrew 20 having the conical portion 21 is inserted into the inclined hole 15 and is rotated by a hexagonal wrench fitted to the hexagonal hole 22 so that the conical portion 21 protrudes from the inclined hole 15, the conical portion 21 comes into contact with the upper end 4a of the heat spreader 4. When the setscrew 20 is rotated further to move the conical portion 21 in the arrow F direction, the heat spreader 4, being pushed by the conical portion 21, moves in the arrow L direction, and the base plate 11 moves in the arrow R direction opposite to the arrow L direction. Such movements of the heat spreader 4 and the base plate 11 cause a shearing force to act on the bonding layer 5.

Figure 4A:
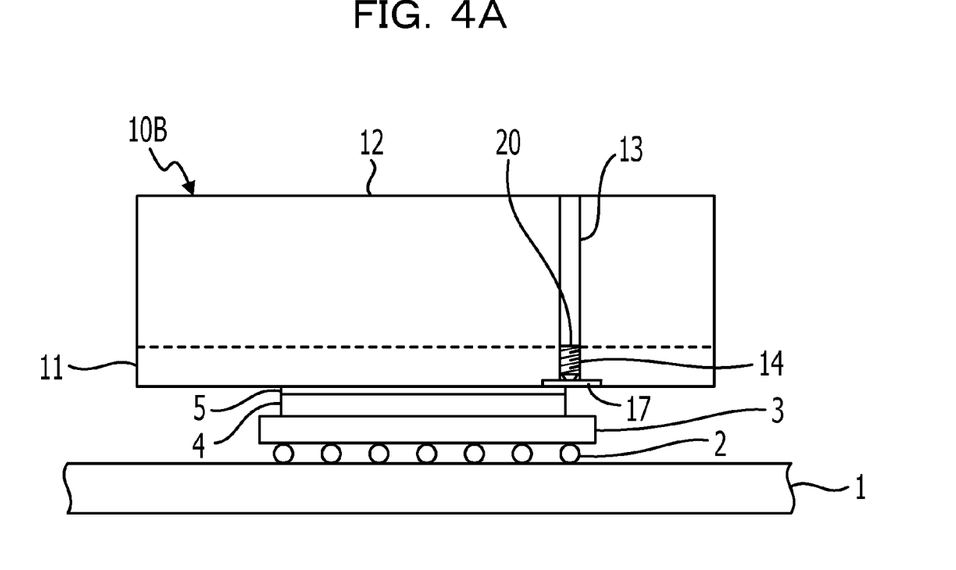
FIG. 4A is a side view of another modified example of the heat sink according to the first embodiment.

FIG. 4A illustrates the configuration of a heat sink 10B, which is a second modification of the first embodiment of the present invention. Also in the heat sink 10B according to the second modification, similarly to the heat sink 10 according to the first embodiment, the pit 13 is provided in the fins 12, and the screw hole 14 communicating with the pit 13 is provided in the base plate 11. The heat sink 10B according to the second modification is different from the heat sink 10 according to the first modification in that a sheet member 17 covering the opening is provided at the opening of the screw hole 14 in the electronic component. The shape of the sheet member 17 may be either square or circular, and the area thereof may be several times larger than the opening. The sheet member 17 is provided assuming that the electronic component will be reused, and it prevents the heat spreader 4 from being scratched by the setscrew 20.

Figure 4B:
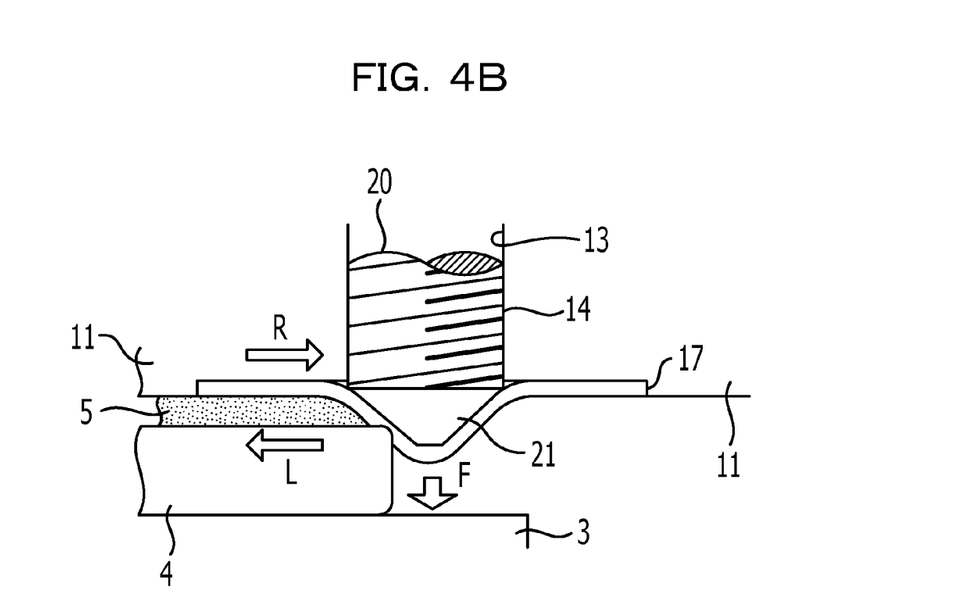
FIG. 4B is an enlarged cross-sectional view of the heat sink depicted in FIG. 4A.

The sheet member 17 can be made, for example, of a flexible metal. When the setscrew 20, serving as a press member, inserted into the pit 13 is rotated by a hexagonal wrench and is moved in the screw hole 14, the conical portion 21 of the setscrew 20 comes into contact with the sheet member 17 and deforms the sheet member 17. When the setscrew 20 is rotated further so that the conical portion 21 protrudes from the screw hole 14, the sheet metal 17 deformed by the conical portion 21 comes into contact with the upper end 4a of the heat spreader 4. This state is shown in FIG. 4B. From this state, when the setscrew 20 is rotated further to move the conical portion 21 in the arrow F direction, the heat spreader 4, being pushed by the sheet metal 17, moves in the arrow L direction, and the base plate 11 moves in the arrow R direction opposite to the arrow L direction. Such movements of the heat spreader 4 and the base plate 11 cause a shearing force to act on the bonding layer 5. By disposing the sheet metal 17 between the tip 21 of the setscrew 20 and the upper end 4a of the heat spreader 4 like this, the sheet metal 17 serves as a cushion, allowing the heat spreader 4 to softly come into contact with the setscrew 20. Thus, damage to the heat spreader 4 can be prevented.

Figure 5A:
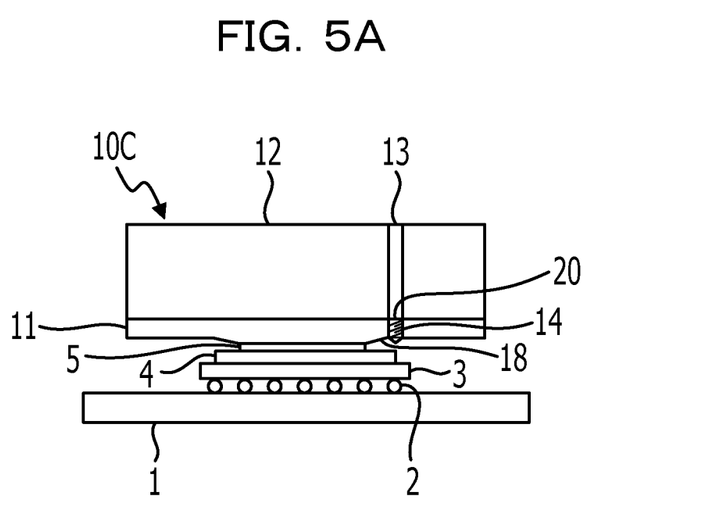
FIG. 5A is a side view of yet another modified example of the heat sink according to the first embodiment.
Figure 5B:
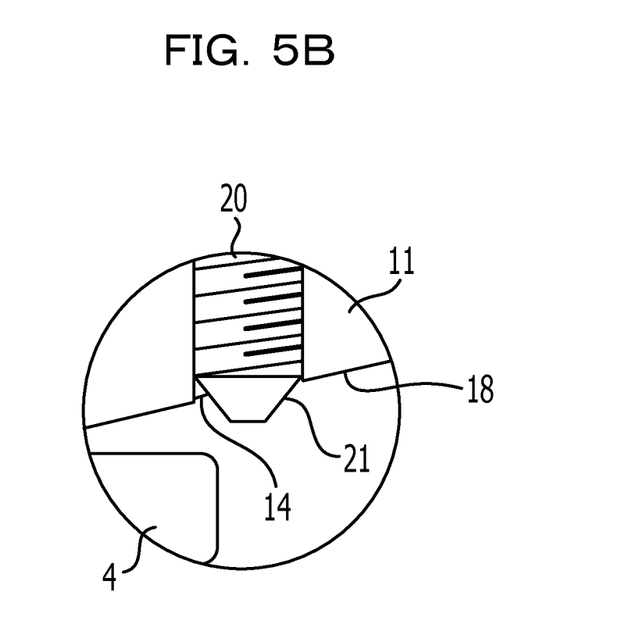
FIG. 5B is an enlarged cross-sectional view of the heat sink depicted in FIG. 5A.

FIG. 5A illustrates the configuration of a heat sink 10C, which is a third modification of the first embodiment of the present invention, and FIG. 5B illustrates a cross section of the relevant part of FIG. 5A. Also in the heat sink 10C according to the third modification, similarly to the heat sink 10 according to the first embodiment, the pit 13 is provided in the fins 12, and the screw hole 14 communicating with the pit 13 is provided in the base plate 11. The heat sink 10C according to the third modification is different from the heat sink 10 according to the first modification in that a tapered portion 18 is formed near the opening of the screw hole 14 in the electronic component. In the third modification, because the tapered portion 18 is formed between the base plate 11 and the top surface of the heat spreader 4, the heat sink 10C can be easily separated by inserting a wedge or the like in this tapered portion 18.

Figure 6A:
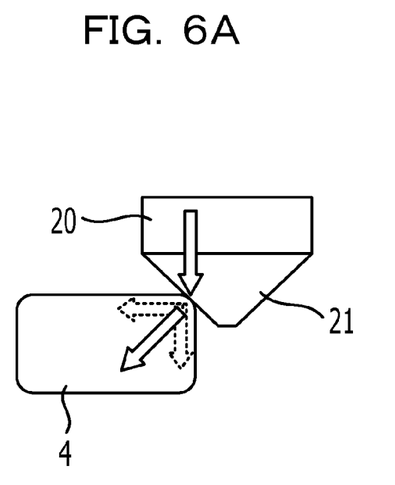
FIGS. 6A to 6D illustrate a mechanical relationship between the tip of the press member and a pressing force which is applied to the electronic component.
Figure 6B:
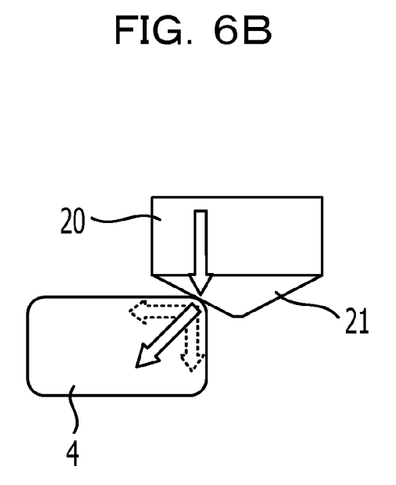

FIGS. 6A to 6D are diagrams for describing the relationship between the shape of the conical portion 21 of the setscrew 20 used in the method of repairing a semiconductor device according to the first embodiment of the present invention and a pressing force, in the horizontal direction, applied to the heat spreader 4. FIG. 6A illustrates a pressing force exerted from the setscrew 20 to the heat spreader 4 when the setscrew 20 moves perpendicular to the heat spreader 4 and the conical portion 21 has an angle of 90°. FIG. 6B illustrates a pressing force exerted from the setscrew 20 to the heat spreader 4 when the setscrew 20 moves perpendicular to the heat spreader 4 and the conical portion 21 has an angle of 120°. As shown, when the screw hole 14 is perpendicular to the heat sink 10, the smaller angle the conical portion 21 has, the larger force with which the heat spreader 4 is pressed in the horizontal direction.

Figure 6C:
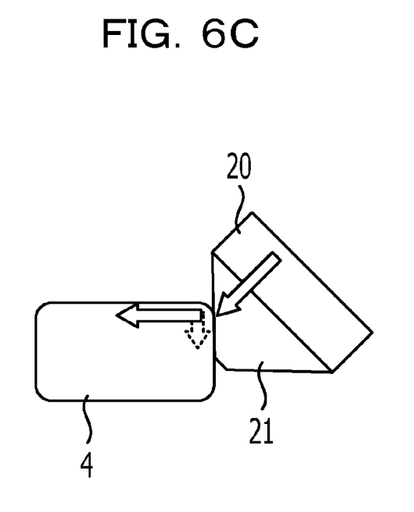
Figure 6D:
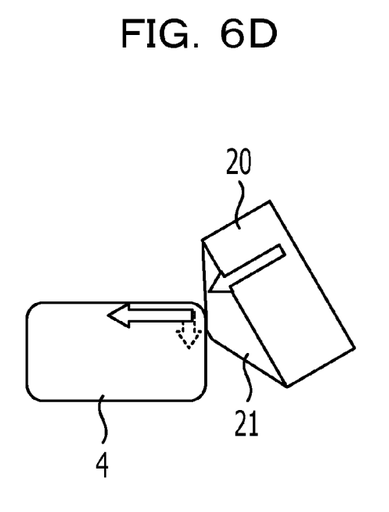

Next, a case where the setscrew 20 moves obliquely relative to the heat spreader 4 will be described. FIG. 6C illustrates a pressing force exerted from the setscrew 20 to the heat spreader 4 when the setscrew 20 moves at an angle of 45° relative to the heat spreader 4, and the conical portion 21 has an angle of 90°. FIG. 6D illustrates a pressing force exerted from the setscrew 20 to the heat spreader 4 when the setscrew 20 moves at an angle of 60° relative to the heat spreader 4 and the conical portion 21 has an angle of 120°. As shown, when the angle of the conical portion 21 is large, the pressing force exerted from the setscrew 20 to the heat spreader 4 can be increased by reducing the inclination of the inclined hole 16 from the horizontal direction. Note that the conical portion 21 of the setscrew 20 may be spherical.

A typical setscrew produces an axial stress of approximately 200 MPa (N/mm$^2$) with a standard fastening torque. Furthermore, in general, adhesive is more susceptible to a shearing force than to a tensile strength, and an assumed shearing strength of the bonding layer is from several MPa to several tens of MPa. Thus, the pressing force exerted by the setscrew is sufficient. For example, a one-component room-temperature-curing-type heat-conducting adhesive and a heat-curing-type heat-conducting adhesive have a tensile strength of from 5.1 to 5.4 MPa, whereas a shearing strength of from 2.0 to 2.6 MPa in the catalog values (from the catalog data provided by Dow Corning Toray Co., Ltd. and Shin-Etsu Chemical Co., Ltd.). When an especially strong bonding layer is to be separated, a plurality of setscrews, serving as pressing devices, may be provided and screwed, as shown in FIGS. 2C and 3A. In such a case, by applying forces for separating the bonding layer to several points, a bonding layer having a large area can be more easily separated.

Figure 7A:
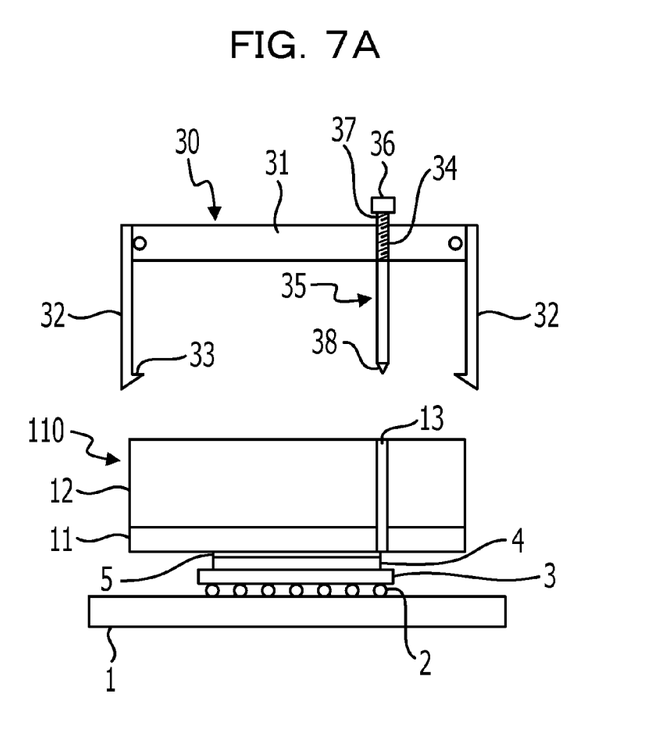
FIGS. 7A and 7B schematically illustrate a heat sink and a method of repairing a semiconductor device according to a second embodiment of the present invention.

FIG. 7A illustrates a method of repairing a semiconductor device according to a second embodiment of the present invention, and a heat sink 110 in the first mounting mode used in this method. Similar to the heat sink 10 according to the first embodiment, shown in FIG. 2A, the heat sink 110 is mounted onto the heat spreader 4, with the bonding layer 5 therebetween, which is secured onto the electronic component 3 mounted onto the printed circuit board 1. The heat sink 110 according to the second embodiment is different from the heat sink 10 according to the first embodiment only in that the pit 13 provided in the fins 12 extends into the base plate 11.

In the heat sink 10 according to the first embodiment, the setscrew 20, serving as a press member, is inserted into the pit 13. In the heat sink 110 according to the second embodiment, instead of the setscrew 20, a rod 35 attached to a clamp jig 30 so as to be rotatable, serving as a pressing device, is inserted into the pit 13. The clamp jig 30 includes a frame 31 having the same length as the overall length of the heat sink 110, flexible mounting legs 32 attached to both ends of the frame 31, and the rod 35 inserted into a screw hole 34 provided in the frame 31. The rod 35 advances downward by being rotated. The mounting legs 32 each have a hook 33 at the tip. The rod 35 includes a head portion 36 having a hexagonal hole, a screw portion 37 adjacent to the head portion 36, and a conical portion 38 at the tip. The screw portion 37 is screwed into the screw hole 34, and the conical portion 38 is inserted into the pit 13 of the heat sink 110. The head portion 36 may have a bolt-shaped head to omit the hexagonal hole.

Figure 7B:
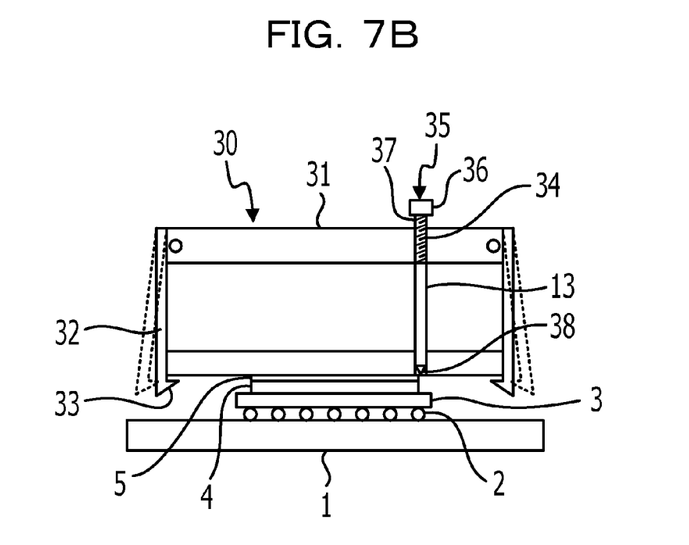

FIG. 7B illustrates a state in which the clamp jig 30 is fitted to the heat sink 110. When the clamp jig 30 is attached to the heat sink 110, the conical portion 38 of the rod 35 is inserted into the pit 13 provided in the fins 12 and is pressed downward. As a result, the flexible mounting legs 32 expand as indicated by dashed lines. When the frame 31 is disposed on the fins 12, the hooks 33 are engaged with the bottom portion of the base plate 11, and the clamp jig 30 is secured to the heat sink 110. When the head portion 36 of the rod 35 is rotated in this state, the rod 35 advances downward. Then, the conical portion 38 of the rod 35 comes into contact with the upper end 4a of the heat spreader 4 and applies a pressing force to the heat spreader 4.

Because a state in which the conical portion 38 of the rod 35 comes into contact with the upper end 4a of the heat spreader 4 and applies a shearing force to the bonding layer 5 is the same as that shown in FIG. 2B, except that the setscrew 20 is replaced by the rod 35. Thus, the description thereof will be omitted. A separating method in which two clamp jigs 30 oriented in the same direction are used so that the positions of the rods 35 are the same as the positions of the setscrews 20 shown in FIG. 2C, and a separating method in which two clamp jigs 30 oriented in the opposite directions are used so that the positions of the rods 35 are the same as the positions of the setscrews 20 shown in FIG. 3A are also possible. Because the use of the clamp jig 30 requires only the machining of the pit 13 in the heat sink 110, the machining in the heat sink 110 can be minimized. The pit 13 may be machined when repairing or replacement is required.

Figure 8A:
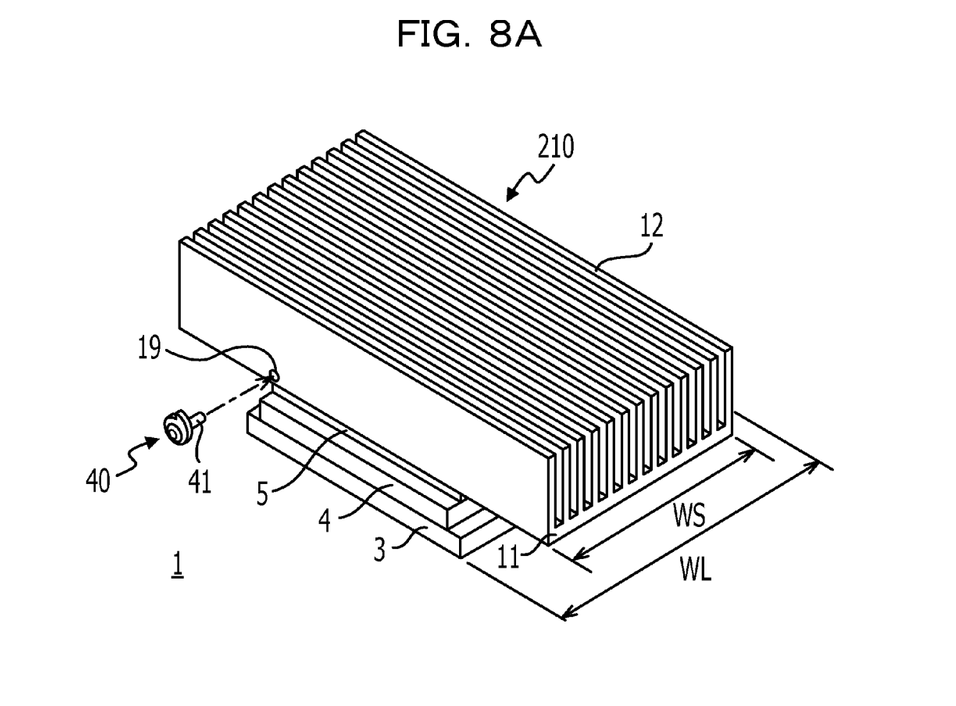
FIGS. 8A to 8C schematically illustrate a heat sink and a method of repairing a semiconductor device according to a third embodiment of the present invention.

FIG. 8A illustrates a method of repairing a semiconductor device according to a third embodiment of the present invention, and a heat sink 210 in the first mounting mode used in this method. Also in this embodiment, the heat sink 210 has a configuration in which the fins 12 are disposed upright on the base plate 11. The heat sink 210 is mounted on the heat spreader 4, with the bonding layer 5 therebetween, which is secured onto the electronic component 3. The width WS of the base plate 11 in the transverse direction is smaller than the width WL of the electronic component 3. Note that the electronic component 3 and the heat spreader 4 have the same width WL. Furthermore, a shaft hole 19 is provided in a side surface, in the longitudinal direction, of the base plate 11 of the heat sink 210, at least at one location near an end of the heat spreader 4, and a cam-type pressing device 40, serving as a press member, is inserted into the shaft hole 19.

Figure 8B:
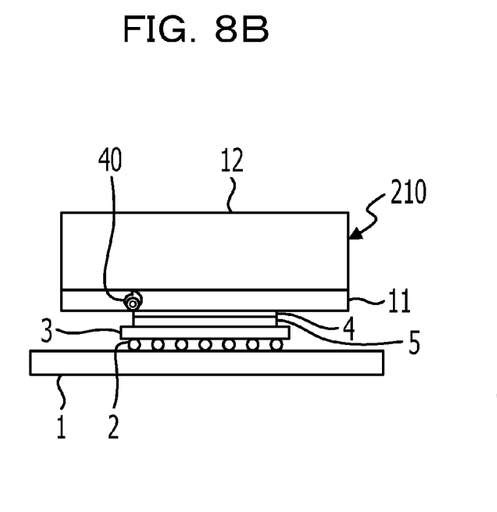
Figure 9A:
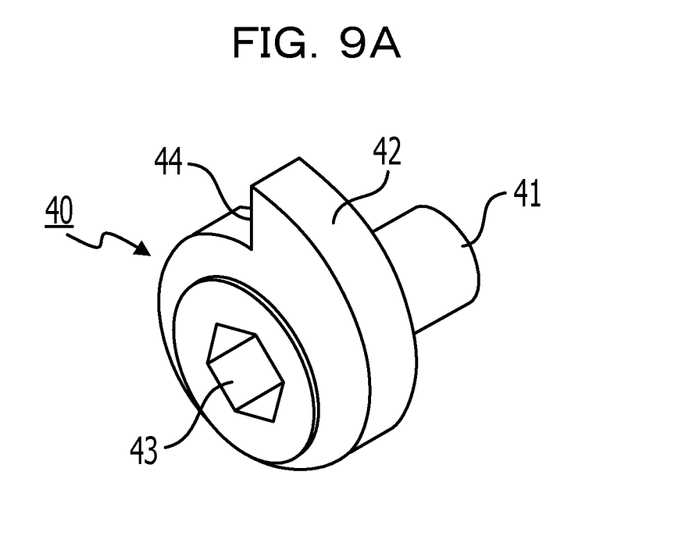
FIG. 9A is an enlarged perspective view of the cam-type press member depicted in FIGS. 8A to 8C.

As shown in FIG. 9A, the cam-type pressing device 40 includes a rotational shaft 41 and a cam portion 42. The cam portion 42 has a hexagonal hole 43 coaxial with the rotational shaft 41, and a pressing portion 44 having a pressing surface perpendicular to the axis of the camshaft 41 is formed on the outer periphery of the cam portion 42. When the heat sink 210 is to be removed from the electronic component 3, the camshaft 41 of the cam-type pressing device 40 is inserted into the shaft hole 19, as shown in FIG. 8A. FIG. 8B is a side view of the heat sink 210 with the cam-type pressing device 40 being fitted to the shaft hole 19. The shaft hole 19 is provided in the base plate 11 such that the cam portion 42 does not come into contact with the heat spreader 4 when the cam-type pressing device 40 is fitted thereto, and such that the pressing portion 44 comes into contact with the heat spreader 4 when the cam-type pressing device 40 is rotated.

Figure 8C:
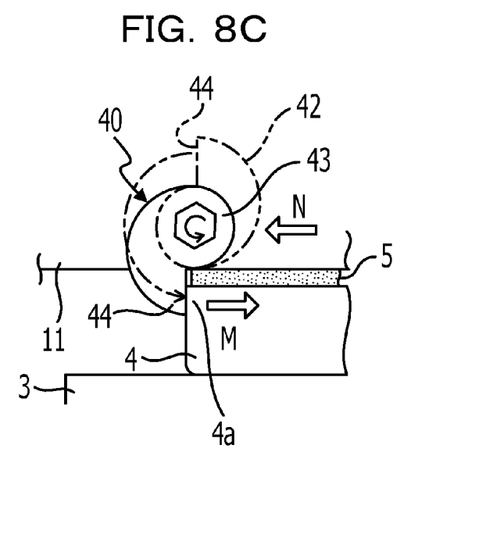
Figure 9B:
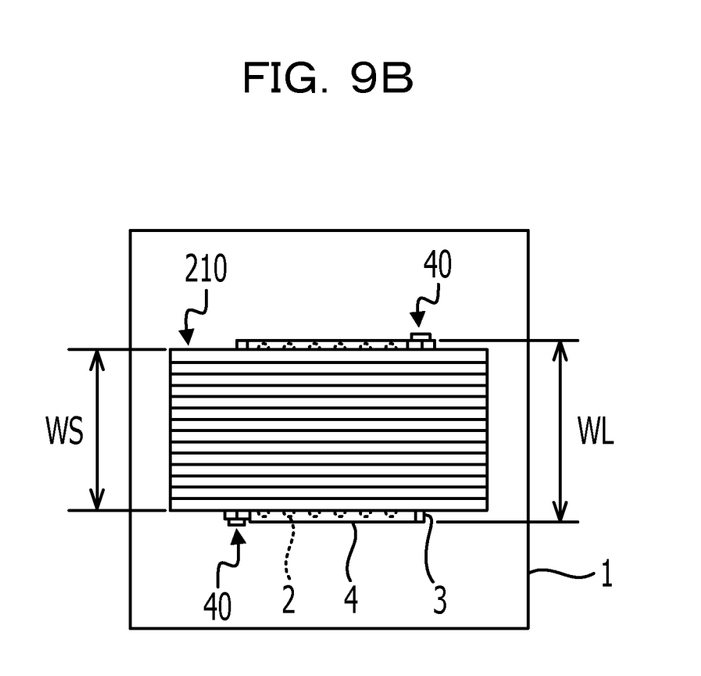
FIG. 9B is a plan view of the heat sink depicted in FIG. 8A.

FIG. 8C illustrates the movement of the cam-type pressing device 40. The cam-type pressing device 40 is located at, for example, a position indicated by a two-dot chain line when attached to the base plate 11, and the pressing portion 44 comes into contact with the upper end 4a of the heat spreader 4 when a hexagonal wrench is inserted into the hexagonal hole 43 and the cam-type pressing device 40 is rotated. From this state, when the cam-type pressing device 40 is rotated further, the heat spreader 4, being pressed by the pressing portion 44, tends to move in the arrow M direction, and the base plate 11 tends to move in the arrow N direction opposite to the arrow M direction. Such movements of the heat spreader 4 and the base plate 11 cause a shearing force to act on the bonding layer 5. The shaft holes 19 may be provided at a plurality of locations in the base plate 11, and the cam-type pressing device 40 may be attached thereto according to the necessity to apply a shearing force to the bonding layer 5. FIG. 9B illustrates an example in which the cam-type pressing devices 40 are attached in the diagonal direction of the heat spreader 4 to apply a shearing force in the rotational direction to the bonding layer 5.

Figures 10A, 10B:
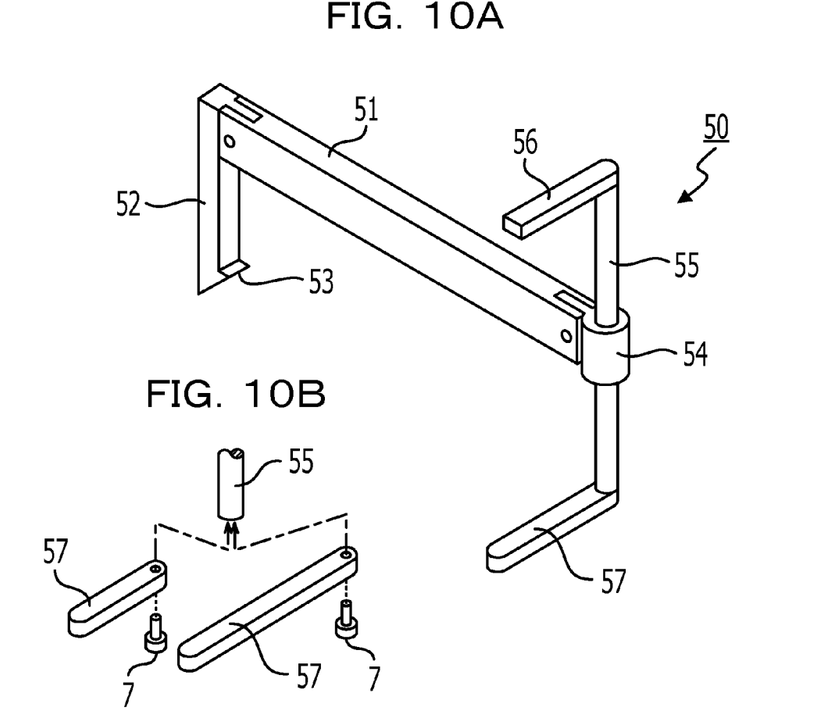
FIGS. 10A to 10C schematically illustrate a jig which is removably affixed to a heat sink, and a method of repairing a semiconductor device according to a fourth embodiment of the present invention.
Figure 10C:
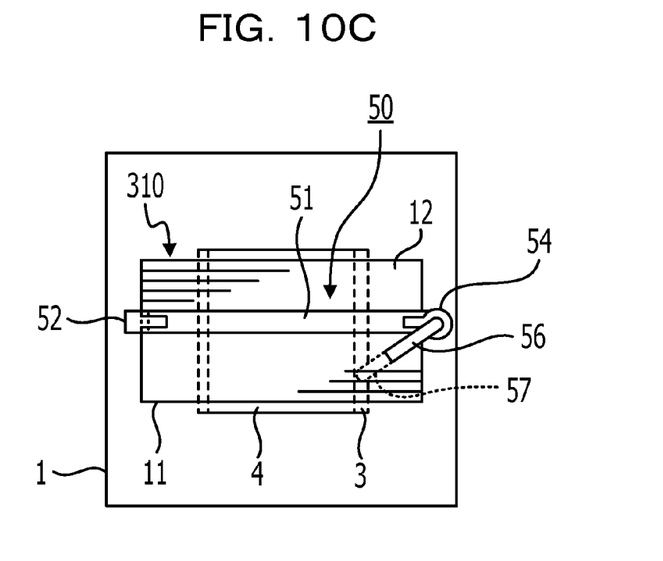

FIGS. 10A to 10C show a first mode of a clamp lever jig 50 used in a method of repairing a semiconductor device according to a fourth embodiment of the present invention. Although the heat sink 210 shown in FIG. 8A may be used as a heat sink 310 used in the separating method according to the fourth embodiment, the heat sink 210 without the shaft hole 19 may also be used. The heat sink 310 according to the fourth embodiment is mounted onto the heat spreader 4, with the bonding layer 5 therebetween, which is secured onto the electronic component 3, similar to the heat sink 210 according to the third embodiment. The size of the base plate 11 is not specifically limited, as long as it is larger than the exterior of the heat spreader 4.

The clamp lever jig 50 can include a frame 51 having the same length as the overall length of the heat sink 310, a flexible mounting leg 52 attached to one end of the frame 51, a tubular portion 54 attached to another end, and a rod 55 supported by the tubular portion 54. The mounting leg 52 has a hook 53 at the tip. The rod 55 has an operation lever 56 at the upper end and a pressing arm 57 at the lower end. As shown in FIG. 10B, by configuring the clamp lever jig 50 such that the pressing arm 57 can be attached to and removed from the lower end of the rod 55 with a screw 7, the pressing arm 57 having an appropriate length may be attached to the rod 55, depending on the distance between the end of the heat sink 310 and the end of the heat spreader 4.

FIG. 10C is a diagram for describing the method of repairing a semiconductor device according to the fourth embodiment of the present invention, showing the clamp lever jig 50 being fitted to the heat sink 310. When the clamp lever jig 50 is attached to the heat sink 310, the clamp lever jig 50 is pushed downward such that a side surface of the pressing arm 57 attached to the rod 55 slides along one end of the heat sink 310. As a result, the flexible mounting leg 52 is bent, the frame 51 is placed on the fins 12, and the hook 53 is engaged with the bottom portion of the base plate 11. Thus, the clamp lever jig 50 is secured to the heat sink 310. When the operation lever 56 of the rod 55 is rotated in this state, the pressing arm 57 is rotated, and the tip of the pressing arm 57 comes into contact with the side surface of the heat spreader 4. The pressing arm 57 attached to the rod 55 is longer than the distance between the end of the heat sink 310 and the end of the heat spreader 4.

In a state in which the tip of the pressing arm 57 is in contact with the side surface of the heat spreader 4, the operation lever 56 is rotated further. As a result, the side surface of the heat spreader 4 is pushed by the tip of the pressing arm 57, causing a shearing force to be applied to the bonding layer 5. A separating method in which two clamp lever jigs 50 oriented in the same direction are used so that the positions at which the tips of the pressing arms 57 come into contact with the side surfaces of the heat spreader 4 the same as the positions of the setscrews 20 shown in FIG. 2C, and a separating method in which two clamp lever jigs 50 oriented in the opposite directions are used so that the positions at which the tips of the pressing arms 57 come into contact with the side surfaces of the heat spreader 4 the same as the positions of the setscrews 20 shown in FIG. 3A are also possible.

Figure 11A:
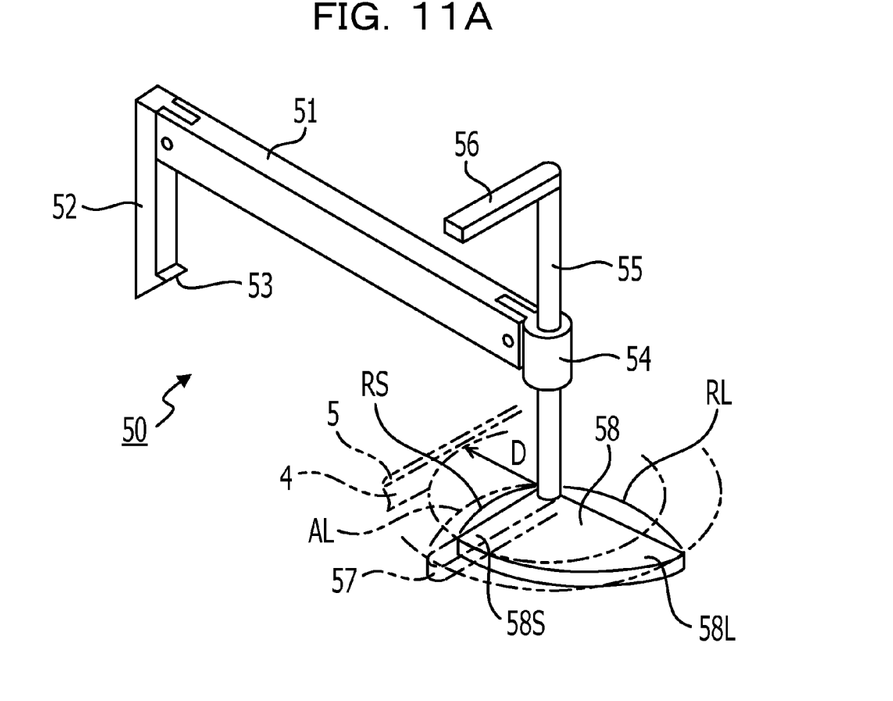
FIGS. 11A and 11B illustrate a modified example of the jig depicted in FIGS. 10A to 10C, and the operation of the jig.
Figure 11B:
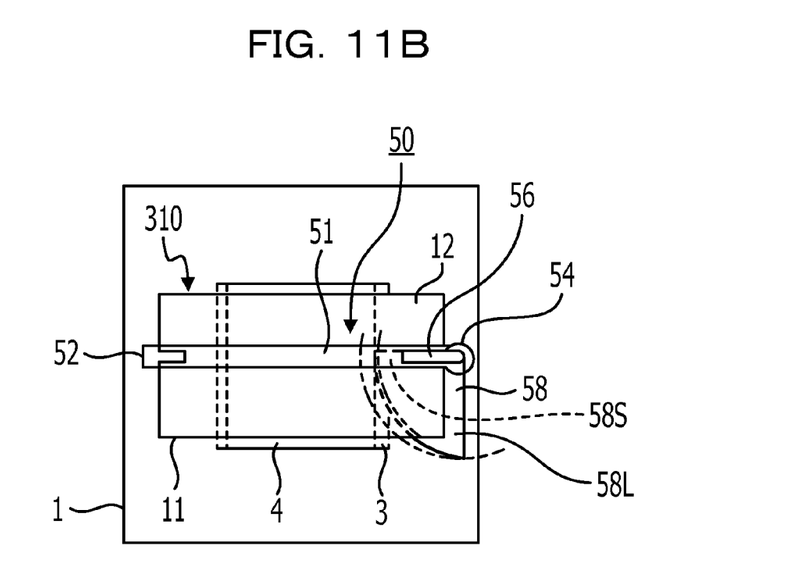

FIG. 11A illustrates a second mode of the clamp lever jig 50 used in the method of repairing a semiconductor device according to the fourth embodiment of the present invention. Instead of the pressing arm 57, a pressing cam 58 can be attached to the rod 55. FIG. 11B illustrates a state in which the clamp lever jig 50 shown in FIG. 11A is attached to the heat sink 310. The pressing cam 58 is formed as part of a circular plate having a continuously changing radius. The minimum radius RS is equal to the distance D between the rod 55 and the side surface of the heat spreader 4, and the maximum radius RL is equivalent to the length AL, which is an example of an appropriate length of the pressing arm 57 to be attached to the rod 55.

Similar to the first mode, the clamp lever jig 50 in the second mode is pushed downward such that the portion of the pressing cam 58 having the minimum radius RS slides along one end of the heat sink 310 and is attached to the heat sink 310. Then, when the operation lever 56 of the rod 55 is rotated, the pressing cam 58 is rotated, and the portion of the pressing cam 58 having the minimum radius RS comes into contact with the side surface of the heat spreader 4. When the operation lever 56 is rotated further from this state, the side surface of the heat spreader 4 is pressed by the outer periphery of the pressing cam 58 whose radius gradually increases, and a shearing force is applied to the bonding layer 5. A plurality of the clamp lever jigs 50 in the second mode may be used to apply a transverse shearing force to the bonding layer or a shearing force in the rotational direction.

Figure 12A:
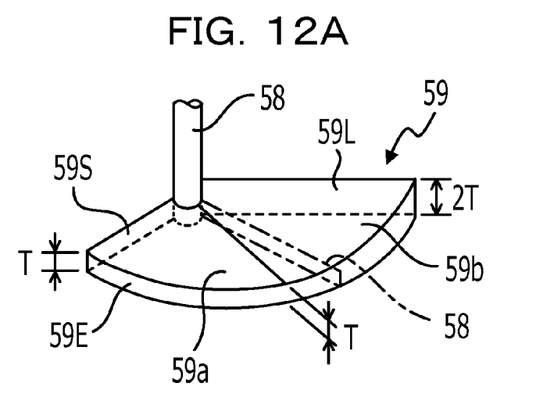
FIGS. 12A to 12C illustrate another modified example of the jig depicted in FIGS. 10A to 10C, and the operation of the jig.

FIG. 12A illustrates a third mode of the clamp lever jig 50 used in the method of repairing a semiconductor device according to the fourth embodiment of the present invention. A pressing cam 59 attached to the rod 55 is the same as the pressing cam 58 in the second mode, except that the thickness at the larger radius side is increased. The pressing cam 58 in the second mode is shown by a two-dot chain line in FIG. 12. In this embodiment, a uniform thickness portion 59a of the pressing cam 59 has a thickness T, and the maximum thickness of a large thickness portion 59b is 2T.

Figure 12B:
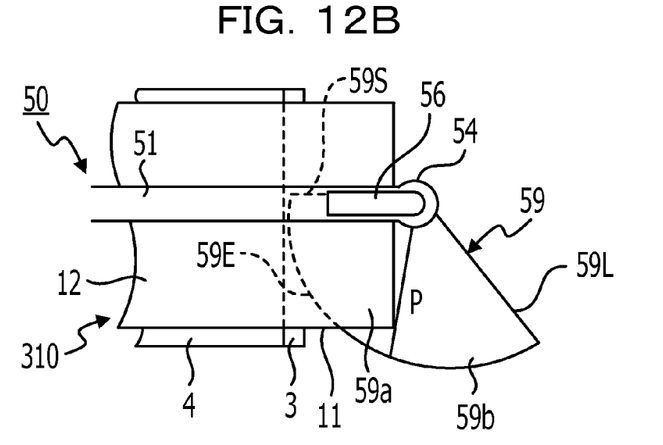

The large thickness portion 59b of the pressing cam 59 in the third mode is a portion having a large radius, on the rear side of a line P, as shown in FIG. 12B. The line P is a radius extending through the tip of a portion not yet overlapping the heat sink 310, when the clamp lever jig 50 is attached to the heat sink 310, the operation lever 56 is rotated, and a minimum radius portion 59S of the pressing cam 59 comes into contact with the side surface of the heat spreader 4. The uniform thickness portion 59a is a portion having a small radius, on the front side of the line P.

Figure 12C:
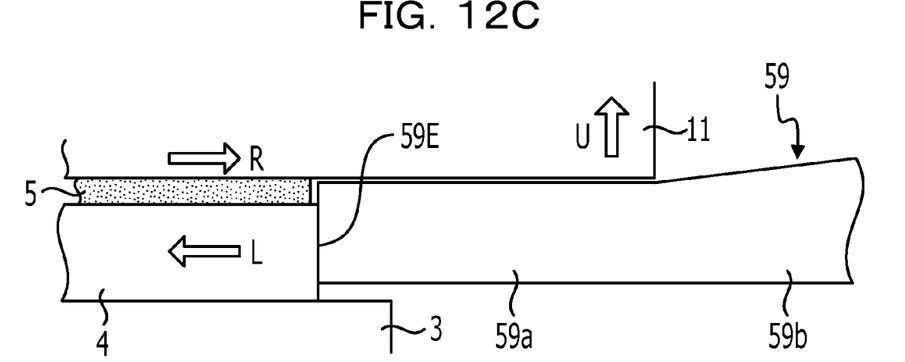

When the operation lever 56 is rotated further from the state shown in FIG. 12B, the side surface of the heat spreader 4 is pushed by an outer periphery 59E of the uniform thickness portion 59a of the pressing cam 59, whose radius gradually increases, as shown in FIG. 12C. As a result, the heat spreader 4 is pushed by the outer periphery 59E and is moved in the arrow L direction, and the base plate 11 is moved in the arrow R direction opposite to the arrow L direction. At the same time, the bottom surface of the base plate 11 is pushed up by the large thickness portion 59b of the pressing cam 59, whose thickness gradually increases, and is moved in the direction shown by the arrow U. Because such movements of the heat spreader 4 and the base plate 11 cause a shearing force and a pulling force in the vertical direction to act on the bonding layer 5, the heat sink can be easily separated. A plurality of the clamp lever jigs 50 in the third mode may be used to apply a transverse shearing force to the bonding layer or a shearing force in the rotational direction.

Furthermore, similarly to the pressing arm 57 according to the first mode, the pressing cam 58 in the second mode and the pressing cam 59 in the third mode may also be configured such that they can be attached to and removed from the rod 55, and a circular plate having most appropriate minimum radius and maximum radius may be provided, depending on the distance between the end of the heat sink 310 and the end of the heat spreader 4.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A method of repairing a semiconductor device including an electronic component, a heat sink provided over the electronic component via a bonding layer, and a press member that moves in the heat sink towards the electronic component, the method comprising:
    moving the press member, in a perpendicular or diagonal direction with respect to an upper end of the electronic component, towards the electronic component until a conical portion of the press member comes into contact with the upper end of the electronic component;
    turning the press member to apply pressure and to move the heat sink in a horizontal direction across the bonding layer on the electronic component; and
    removing the heat sink from the electronic component,
    wherein the movement of the heat sink on the electronic component reduces a shearing force in the bonding layer and reduces a bonding force of the bonding layer to separate the heat sink from the electronic component.

* * * * *